(12) United States Patent
Rousseau et al.

(10) Patent No.: US 9,885,751 B2
(45) Date of Patent: Feb. 6, 2018

(54) DYNAMIC PROCESS FOR ADAPTIVE TESTS

(71) Applicant: OPTIMAL PLUS LTD., Holon (IL)

(72) Inventors: Eran Rousseau, San Diego, CA (US); Arie Peltz, Nes Ziona (IL); Shaul Teplinsky, San Francisco, CA (US)

(73) Assignee: OPTIMAL PLUS LTD., Holon (IL)

( * ) Notice: Subject to any disclaimer, the term of this patent is extended or adjusted under 35 U.S.C. 154(b) by 27 days.

(21) Appl. No.: 14/958,462

(22) Filed: Dec. 3, 2015

(65) Prior Publication Data

US 2017/0160342 A1 Jun. 8, 2017

(51) Int. Cl.
*G01R 31/317* (2006.01)
*G01R 31/3177* (2006.01)

(52) U.S. Cl.
CPC ..... *G01R 31/3172* (2013.01); *G01R 31/3177* (2013.01); *G01R 31/31725* (2013.01)

(58) Field of Classification Search
CPC .............................................. G01R 31/318536
USPC ........................................ 714/726, 728, 732
See application file for complete search history.

(56) References Cited

U.S. PATENT DOCUMENTS

| | | | |
|---|---|---|---|
| 4,363,131 A * | 12/1982 | Froese | H04B 17/309 455/42 |
| 4,497,056 A | 1/1985 | Sugamori | |
| 5,557,559 A * | 9/1996 | Rhodes | G01R 31/31719 324/750.05 |
| 5,671,351 A | 9/1997 | Wild et al. | |
| 5,726,996 A | 3/1998 | Chakradhar et al. | |
| 6,473,794 B1 * | 10/2002 | Guheen | H04L 41/22 709/223 |
| 7,646,204 B2 | 1/2010 | Zhang | |
| 7,890,288 B1 | 2/2011 | Raneri | |
| 8,112,249 B2 | 2/2012 | Gurov et al. | |
| 2001/0003420 A1 * | 6/2001 | Delcourt | G01D 3/022 324/750.02 |
| 2002/0194545 A1 * | 12/2002 | Abbott | G11C 29/26 714/42 |
| 2004/0025123 A1 | 2/2004 | Angilivelil | |
| 2006/0284661 A1 | 12/2006 | Zhang | |
| 2011/0251812 A1 | 10/2011 | Gurov et al. | |
| 2013/0006567 A1 | 1/2013 | Horn | |
| 2014/0339558 A1 | 11/2014 | Chen et al. | |
| 2015/0128103 A1 | 5/2015 | Stratton et al. | |
| 2015/0293174 A1 | 10/2015 | Ge et al. | |
| 2016/0062954 A1 * | 3/2016 | Ruff | G06F 17/21 715/249 |

OTHER PUBLICATIONS

Online publication for Adaptive Test cited at www.semi.org/en/sites/semi.org/files/docs/ITRS_AdaptiveTest_WhitePaper2013.pdf (Jul. 23, 2014).

(Continued)

*Primary Examiner* — Fritz Alphonse
(74) *Attorney, Agent, or Firm* — Browdy and Neimark, PLLC

(57) ABSTRACT

A method for modifying the execution sequence of tests for testing an object on a test system. The tests include a group of tests that is a candidate for replacement. The method includes: while executing the tests according to the execution sequence and before executing the group of tests, modifying, in real time, the execution sequence including: executing a delay instead of the group of tests, wherein the delay is related to the group of tests.

43 Claims, 8 Drawing Sheets

(56) References Cited

OTHER PUBLICATIONS

Online publication for Path to Widespread Adaptive Test Revealed at CAST Workshop downloaded Jun. 23, 2016 from www.semi.org/en/node/48166 (Apr. 13, 2015).
online publication for Settling time downloaded Jun. 23, 2016, from en.wikipedia.org/wiki/Settling_time (Aug. 9, 2015).

* cited by examiner

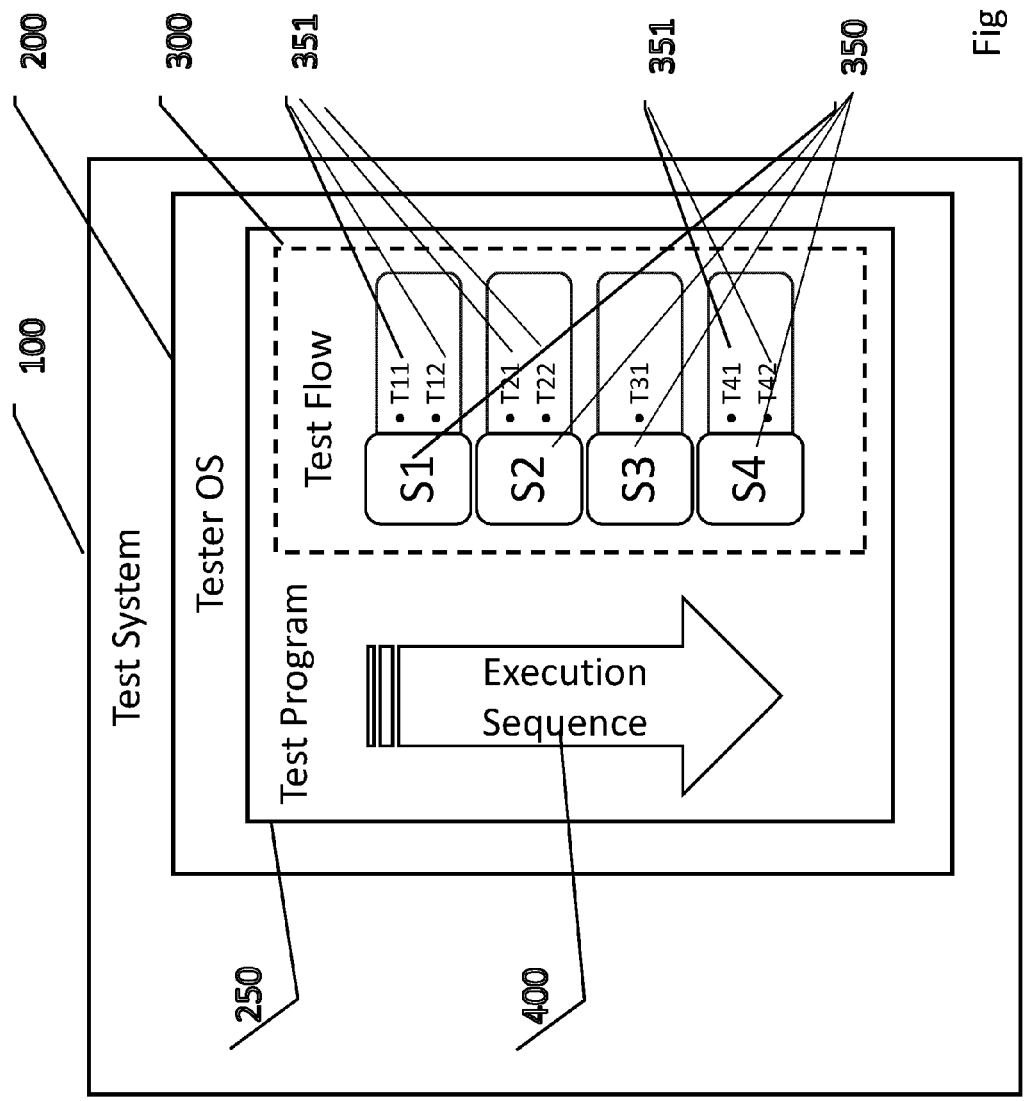

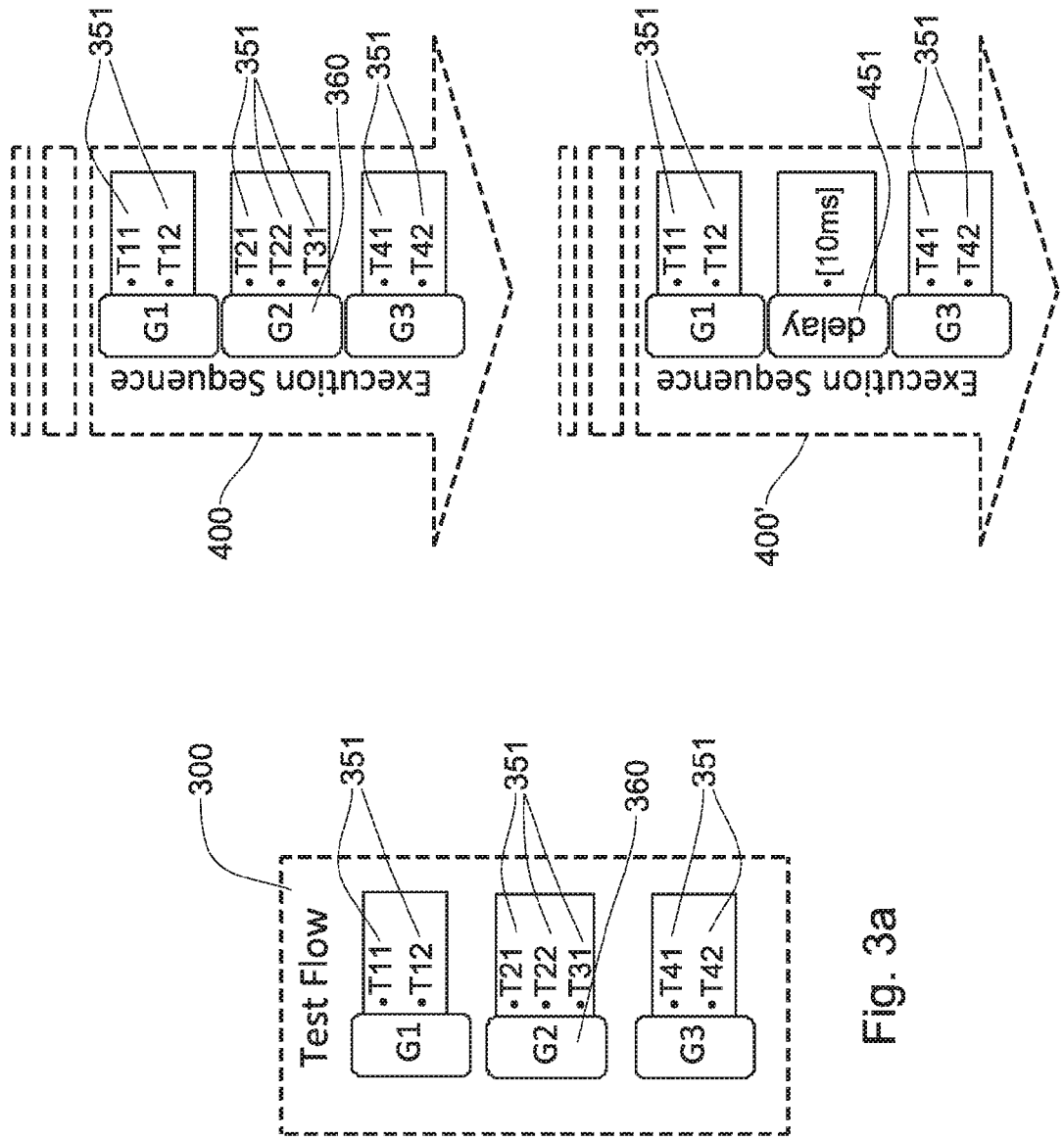

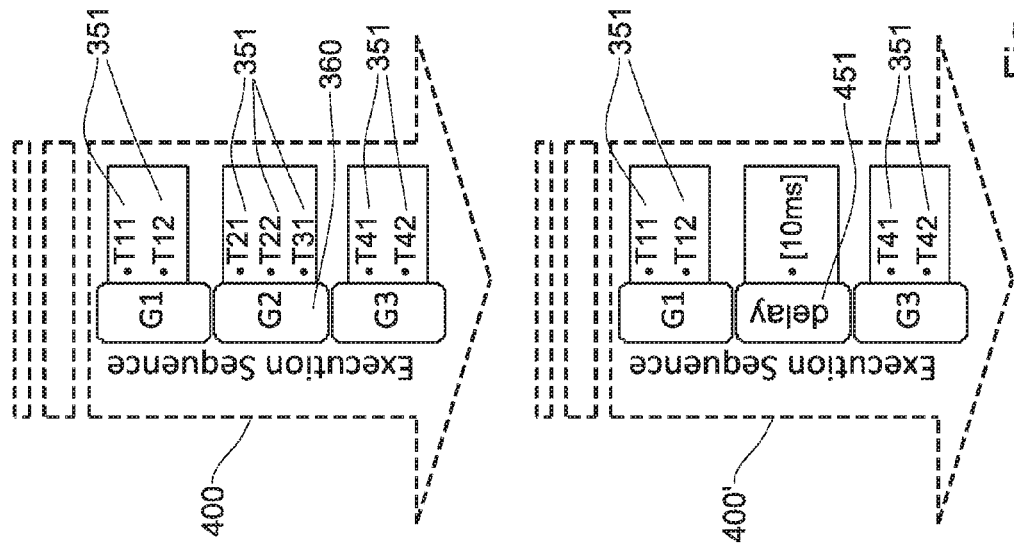
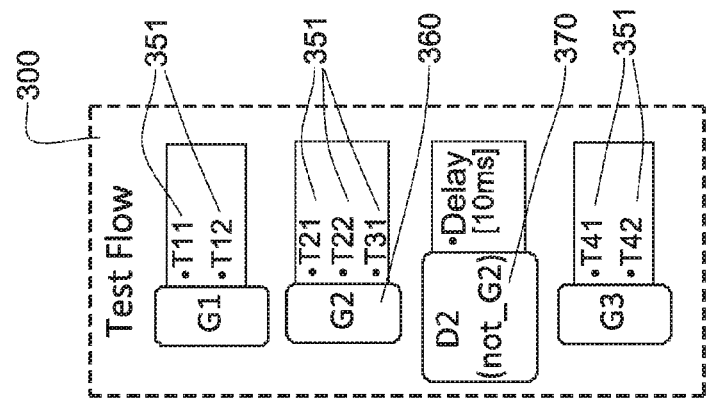
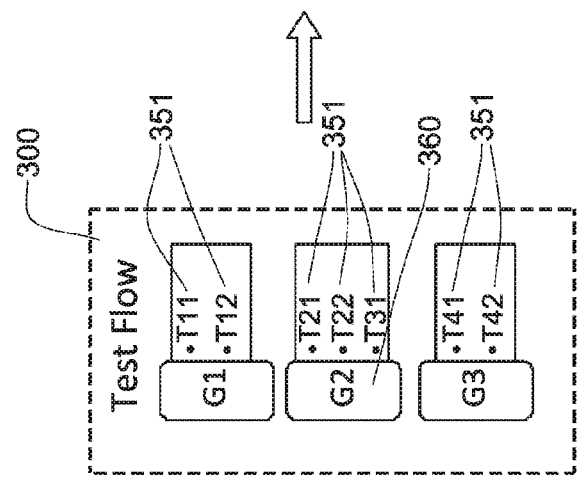
Fig. 4a
Fig. 4b
Fig. 4c

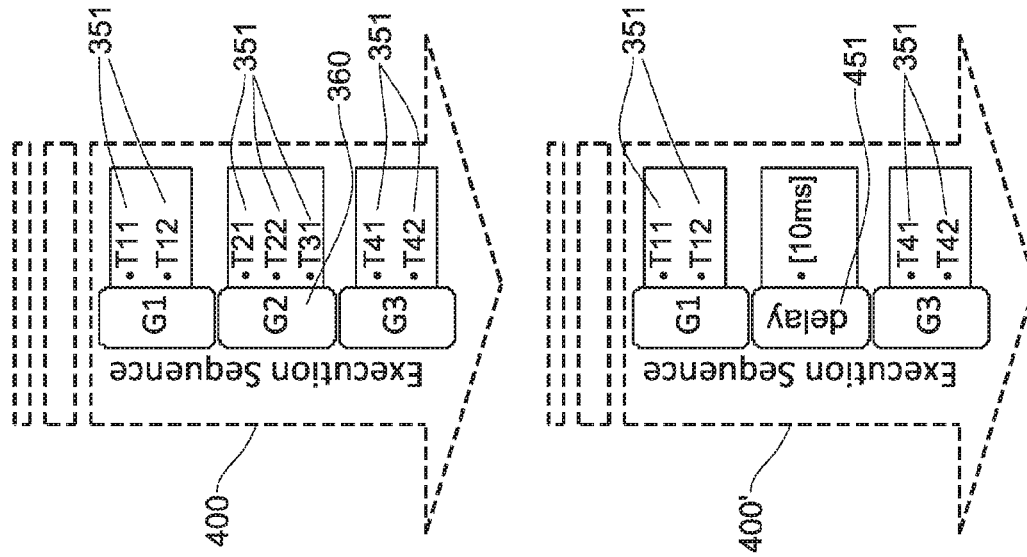
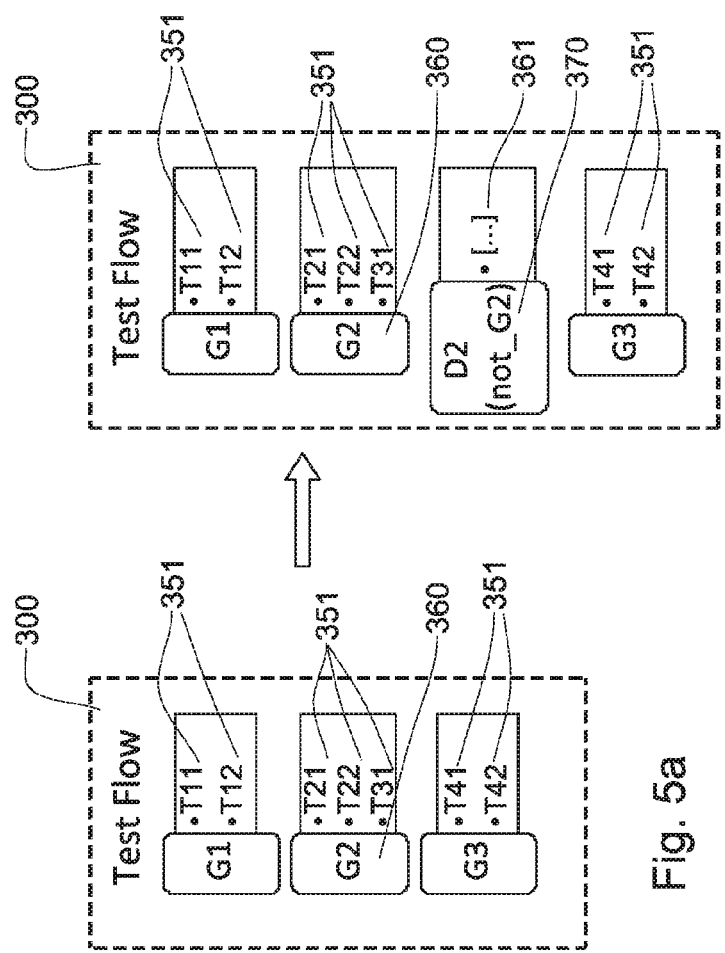

DYNAMIC PROCESS FOR ADAPTIVE TESTS

TECHNOLOGICAL FIELD

The present invention is in the field of Dynamic Processes for Adaptive Tests (AT).

BACKGROUND OF THE INVENTION

Adaptive Test (AT) is a broad term used to describe methods that change test conditions, test flow, test content and test limits based on manufacturing test data and statistical data analysis. AT has been identified as an important test process and methodology change needed to achieve lower test costs, using the most recent release of the International Technology Roadmap for Semiconductors (ITRS http://www.itrs.net/). The term AT is not limited to semiconductors and can be applied to testing of other types of devices.

Attention is first drawn to FIG. 1 illustrating a generalized test system in accordance with the prior art.

FIG. 1 shows tests 351 (in the example of FIG. 1 T11 to T42) within a test flow 300 of tests accommodated in a test program 250. The tests may include group(s) of tests each containing a single test or multiple tests. The sequence in which the tests are executed, also known as an execution sequence of tests 400, may be determined, in real-time, by the operating system (OS) of the test system 200 at least in part based on the test flow 300. A sequence of operations in accordance with the prior art is shown in FIG. 7. During real-time AT based on manufacturing test data and/or statistical data analysis certain group(s) of tests (hereinafter group of tests that are candidates for removal) may be removed from the execution sequence, and are sometimes also referred to as bypassed, skipped or disabled groups. Such group(s) of tests that are removed from the execution sequence are not executed by the test system.

Dynamically modifying the execution sequence of tests on a test system (100) based on manufacturing test data and statistical data analysis can be used to reduce test time— Adaptive Test Time Reduction (ATTR), to improve yield or to prevent damage to devices or their reliability. Modification of test process or content can be performed in real-time without changing test programs. One of the main challenges of real-time dynamical modification of test process or content, is uncertainty whether subsequent tests will remain stable after a group of tests is removed from the execution sequence.

In addition to a logical dependence between tests, a given group of tests (i.e. one or more tests) may inter alia serve as a time buffer for settling of residual noise left from preceding test or tests, thus enabling tests following after such a group to be executed properly. The residual noise results from a well-known phenomenon that devices cannot respond instantaneously and will exhibit transient responses when they are subjected to inputs or disturbances. During testing, both devices under test (DUT) (referred to more generally as tested objects) and devices within components of a testing system, can be sources of said residual noise. Depending on type of the DUT and the testing system, the residual noise can be electrical, mechanical, thermal, electromagnetic, etc. The noise can be analog or digital. Settling time may be referred to as the time elapsed from the application of an ideal instantaneous step input to the time at which the device output has entered and remained within a specified error band. It may be difficult to identify or characterize the dependency on the given group of tests to serve as a buffer for settling at the time of real-time AT and therefore there may be uncertainty about how subsequent remaining tests will perform if a group of tests is removed from the execution sequence.

Because of this uncertainty, real-time AT is often replaced by test program re-structuring followed by a lengthy test program qualification.

References considered to be relevant as background to the presently disclosed subject matter are listed below:
http://www.semi.org/en/sites/semi.org/files/docs/ITRS_AdaptiveTest_WhitePaper2013.pdf
https://en.wikipedia.org/wiki/Settling_time.
https://www.lens.org/lens/search?q=settling+time+%26%26+test+time+reduction&l=en
https://www.lens.org/lens/patent/US_7646204_B2 "Method And System For Testing A Settling Time For A Device-under-test"
https://www.lens.org/lens/patent/US_5726996_A "Process For Dynamic Composition And Test Cycles Reduction"
https://www.lens.org/lens/search?q=settling+time+%26%26+test+reordering&l=en
https://www.lens.org/lens/patent/US_2013_0006567_A1 "Method And Apparatus For Scheduling A Use Of Test Resources Of A Test Arrangement For The Execution Of Test Groups"

Acknowledgement of the above references herein is not to be inferred as meaning that these are in any way relevant to the patentability of the presently disclosed subject matter.

There is thus a need in the art for a new technique for dynamically modifying an execution sequence of tests in real time.

SUMMARY OF THE INVENTION

The present invention is in the field of Dynamic process for Adaptive Testing (AT).

Thus, in accordance with an aspect of the invention, there is provided a method for modifying the execution sequence of tests for testing an object on a test system; the tests include a group of tests that is a candidate for replacement, the method comprising, while executing the tests according to the execution sequence and before executing the group of tests, modifying, in real time, the execution sequence including: executing a delay instead of the group of tests, wherein the delay is related to the group of tests.

Thus, in accordance with an embodiment of the invention, there is further provided a method, wherein the modifying of execution of the sequence includes: receiving in the test system an indication to execute the delay related to the group of tests and to not execute the group of tests.

Thus, in accordance with an embodiment of the invention, there is yet further provided a method, wherein a test flow is augmented by a computer system before the execution of the tests by inserting the delay related to the group of tests, for selectively executing either the delay or the group of tests, and wherein, modifying the execution sequence includes: at least one of (i) receiving in the test system an indication to not execute the group of tests, and (ii) receiving in the test system an indication to execute the delay.

Thus, in accordance with an embodiment of the invention, there is yet further provided a method, wherein remaining tests in the execution sequence are not logically dependent on the group of tests.

Thus, in accordance with an embodiment of the invention, there is yet further provided a method, wherein the group of tests serves at least as a time buffer for settling time after previous tests in the execution sequence.

Thus, in accordance with an embodiment of the invention, there is yet further provided a method, wherein the tests include at least one other group of tests that is a candidate for replacement, and wherein modifying the execution sequence includes executing at least one other delay instead of the at least one other group of tests, wherein the at least one other delay is related to the at least one other group of tests.

Thus, in accordance with an embodiment of the invention, there is yet further provided a method wherein the object is a semiconductor chip.

Thus, in accordance with an embodiment of the invention, there is yet further provided a method, wherein execution of the delay reduces the risk of instability arising from the removal of the group of tests.

Thus, in accordance with an aspect of the invention, there is yet further provided a method for providing an indication to a test system to modify an execution sequence of tests for testing an object on the test system; the tests include a group of tests that is a candidate for replacement: comprising, by a computer system associated with the test system: while the tests are being executed by the test system according to the execution sequence, if it is determined that the group of tests is not to be executed, obtaining a delay related to the group of tests, and before the group of tests is executed, providing the indication to the test system to modify in real time the execution sequence of the tests for executing the delay instead of the group of tests.

Thus, in accordance with an embodiment of the invention, there is yet further provided a method, wherein the at least one of the delay and the group of tests is determined by the computer system based on one or more rules.

Thus, in accordance with an embodiment of the invention, there is yet further provided a method, wherein the delay is shorter than an execution duration of the group of tests related thereto.

Thus, in accordance with an embodiment of the invention, there is yet further provided a method, wherein the delay is set to a default value.

Thus, in accordance with an embodiment of the invention, there is yet further provided a method, wherein the delay is set at least partly based on an input received by the computer system.

Thus, in accordance with an embodiment of the invention, there is yet further provided a method, wherein the delay is set at least partly based on estimated settling time.

Thus, in accordance with an embodiment of the invention, there is yet further provided a method, wherein the delay is set at least partly based on the execution duration of the group of tests.

Thus, in accordance with an embodiment of the invention, there is yet further provided a method, wherein the delay is set at least partly based on properties of tests that precede the group of tests.

Thus, in accordance with an embodiment of the invention, there is yet further provided a method, wherein the delay is set at least partly based on historical performance of tests that follow after the group of tests.

Thus, in accordance with an embodiment of the invention, there is yet further provided a method, wherein the delay is set at least partly based on calibration data for the test system.

Thus, in accordance with an embodiment of the invention, there is yet further provided a method, wherein the delay is set at least partly based on simulation data.

Thus, in accordance with an embodiment of the invention, there is yet further provided a method, further comprising: in response to the provision of indication, the test system executing the delay instead of the group of tests.

Thus, in accordance with an embodiment of the invention, there is yet further provided a method, wherein the tests include at least one other group of tests that is a candidate for replacement, and wherein the indication to modify the execution sequence is provided for executing at least one other delay instead of the at least one other group of tests, wherein the at least one other delay is related to the at least one other group of tests.

Thus, in accordance with an aspect of the invention, there is yet further provided a method for providing an indication to a test system to modify an execution sequence of tests for testing an object on the test system, the tests including a group of tests that is a candidate for replacement: comprising, by a computer system associated with the test system:
(i) obtaining the group of tests;
(ii) receiving from the test system a first indication that a test flow is loaded;
(iii) augmenting the test flow by inserting the delay related to the group of tests for selectively executing either the delay or the group of tests and providing the augmented test flow to the test system;
(iv) while the tests are being executed by the test system according to the execution sequence,
if it is determined that the group of tests is not to be executed, obtaining a delay related to the group of tests,
and before the group of tests is executed, providing the indication to said test system to modify in real time the execution sequence of the tests for executing the delay instead of the group of tests.

Thus, in accordance with an embodiment of the invention, there is yet further provided a method, further comprising: in response to said provision of indication, the test system executing the delay instead of the group of tests.

Thus, in accordance with an embodiment of the invention, there is yet further provided a method, wherein the tests include at least one other group of tests that is a candidate for replacement, and wherein the augmentation of the test flow further includes inserting at least one other delay related to the at least one other group of tests for, with respect to any other delay and related other group of tests, selectively executing either the other delay or the other group of tests.

Thus, in accordance with an embodiment of the invention, there is yet further provided a method, wherein the indication to modify the execution sequence is provided for executing the at least one other delay instead of the at least one other group of tests.

Thus, in accordance with an aspect of the invention, there is yet further provided a computer system for providing an indication to a test system associated therewith to modify an execution sequence of tests for testing an object on the test system; the tests include a group of tests that is a candidate for replacement, the computer system being configured to perform, including: while the tests are being executed by the test system according to the execution sequence, if it is determined that the group of tests is not to be executed, obtaining a delay related to the group of tests, and before the group of tests is executed, providing the indication to the test system to modify in real time the execution sequence of the tests for executing the delay instead of the group of tests.

Thus, in accordance with an embodiment of the invention, there is yet further provided a computer system, further comprising: in response to the provision of indication, the test system being configured to execute the delay instead of the group of tests.

Thus, in accordance with an embodiment of the invention, there is yet further provided a computer system, wherein the tests include at least one other group of tests that is a candidate for replacement, and wherein the indication to modify the execution sequence is provided for executing at least one other delay instead of the at least one other group of tests, wherein the at least one other delay is related to the at least one other group of tests.

Thus, in accordance with an embodiment of the invention, there is yet further provided a computer system, wherein the test system is associated with the computer system by utilizing an Application Programming Interface (API).

Thus, in accordance with an embodiment of the invention, there is yet further provided a computer system, being configured to provide an indication to the test system through the API.

Thus, in accordance with an embodiment of the invention, there is yet further provided a computer system, wherein the computer system includes a first computer system and a proxy computer system and wherein the test system is associated with the computer system by utilizing the Proxy computer system.

Thus, in accordance with an embodiment of the invention, there is yet further provided a computer system wherein the first computer system being configured to provide the indication to the test system through the proxy computer system.

Thus, in accordance with an aspect of the invention, there is yet further provided a computer system for providing an indication to a test system associated therewith to modify an execution sequence of tests for testing an object on the test system; the tests include a group of tests that is a candidate for replacement, the computer system being configured to perform, including:
 (i) obtaining the group of tests;
 (ii) receiving from the test system a first indication that a test flow is loaded;
 (iii) augmenting the test flow by inserting the delay related to the group of tests for selectively executing either the delay or the group of tests and providing the augmented test flow to the test system;
 (iv) while the tests are being executed by the test system according to the execution sequence,
  if it is determined that the group of tests is not to be executed, obtaining a delay related to the group of tests,
  and before the group of tests is executed, providing the indication to the test system to modify in real time the execution sequence of the tests for executing the delay instead of the group of tests.

Thus, in accordance with an embodiment of the invention, there is yet further provided a computer system, further comprising in response to the provision of indication, the test system being configured to execute the delay instead of the group of tests.

Thus, in accordance with an embodiment of the invention, there is yet further provided a computer system, wherein the tests include at least one other group of tests that are candidates for replacement, and wherein the augmentation of the test flow further includes inserting at least one other delay related to the at least one other group of tests for, with respect to any other delay and related other group of tests, selectively executing either the other delay or the other group of tests.

Thus, in accordance with an embodiment of the invention, there is yet further provided a method wherein the indication to modify the execution sequence is provided for executing the at least one other delay instead of the at least one other group of tests.

Thus, in accordance with an embodiment of the invention, there is yet further provided a computer system wherein the test system is associated with the computer system by utilizing an Application Programming Interface (API).

Thus, in accordance with an embodiment of the invention, there is yet further provided a computer system being configured to receive the first indication from the test system and to provide the indication to the test system through the API.

Thus, in accordance with an embodiment of the invention, there is yet further provided a computer system wherein the computer system includes a first computer system and a proxy computer system and wherein the test system is associated with the computer system by utilizing the Proxy computer system.

Thus, in accordance with an embodiment of the invention, there is yet further provided a computer system wherein the first computer system being configured to receive the first indication from the test system through the proxy computer system, and wherein the first computer system being configured to provide the indication to the test system through the proxy computer system.

Thus, in accordance with an embodiment of the invention, there is yet further provided a computer system being configured to augment the test flow of the tests including specifying the delay as a slot.

Thus, in accordance with an aspect of the invention, there is yet further provided a computer program product comprising a non-transitory computer useable medium having computer readable program code embodied therein for providing an indication to a test system to modify an execution sequence of tests for testing an object on the test system; the tests include a group of tests that is a candidate for replacement the computer program product comprising:
 computer readable program code for causing the computer system, while the tests are being executed by the test system according to the execution sequence,
  if it is determined that the group of tests is not to be executed, obtaining a delay related to the group of tests, and before the group of tests is executed, providing the indication to the test system to modify in real time the execution sequence of the tests for executing the delay instead of the group of tests.

Thus, in accordance with an aspect of the invention, there is yet further provided a computer program product comprising a non-transitory computer useable medium having computer readable program code embodied therein for providing an indication to a test system to modify an execution sequence of tests for testing an object on the test system; the tests include a group of tests that is a candidate for replacement the computer program product comprising:
 computer readable program code for causing a computer system to obtain the group of tests;
 computer readable program code for causing a computer system to receive from the test system a first indication that a test flow is loaded;
 computer readable program code for causing a computer system to augment the test flow by inserting the delay related to the group of tests for selectively executing either the delay or the group of tests and providing the augmented test flow to the test system;

computer readable program code for causing the computer system, while the tests are being executed by the test system according to the execution sequence, if it is determined that the group of tests is not to be executed, obtaining a delay related to the group of tests, and before the group of tests is executed, providing the indication to the test system to modify in real time the execution sequence of the tests for executing the delay instead of the group of tests.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 1 illustrates a generalized test system in accordance with the prior art;

FIG. 3A-B illustrate, schematically, a test flow that includes tests, corresponding execution sequence of the tests and a modified execution sequence, in accordance with certain embodiments of the invention;

FIG. 4A-C illustrate, schematically, a test flow, an augmented test flow and corresponding execution sequences, in accordance with certain embodiments of the invention;

FIG. 5A-C illustrate, schematically, a test flow, an augmented test flow and corresponding execution sequences, in accordance with certain embodiments of the invention;

DETAILED DESCRIPTION OF EMBODIMENTS

The present invention is in the field of Dynamic Processes for Adaptive Tests (AT).

Note that in the description below, whenever reference is made to action(s) performed by a test system (e.g. 100 in FIG. 1), this may embrace an action performed by a computer program such as, but not limited to, a test system's Operating System (OS) running on a processor(s) forming part of the test system.

For simplicity, the various embodiments are described below with reference to semiconductor Device Under Test (DUT). Note that the invention is not bound to DUT which is only one example of an object and accordingly the invention may be applied to testing objects other than a semiconductor DUT.

Figure 2B:
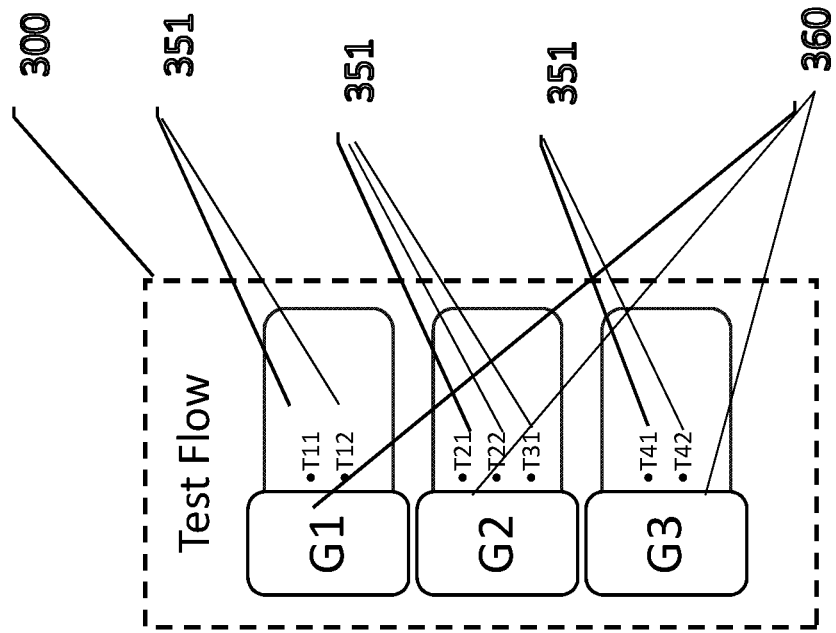
FIGS. 2A-B illustrate, schematically, an exemplary process of combining a logically dependent group of tests for obtaining a test flow that includes a combined group of tests that are candidates for removal.
Figure 2A:
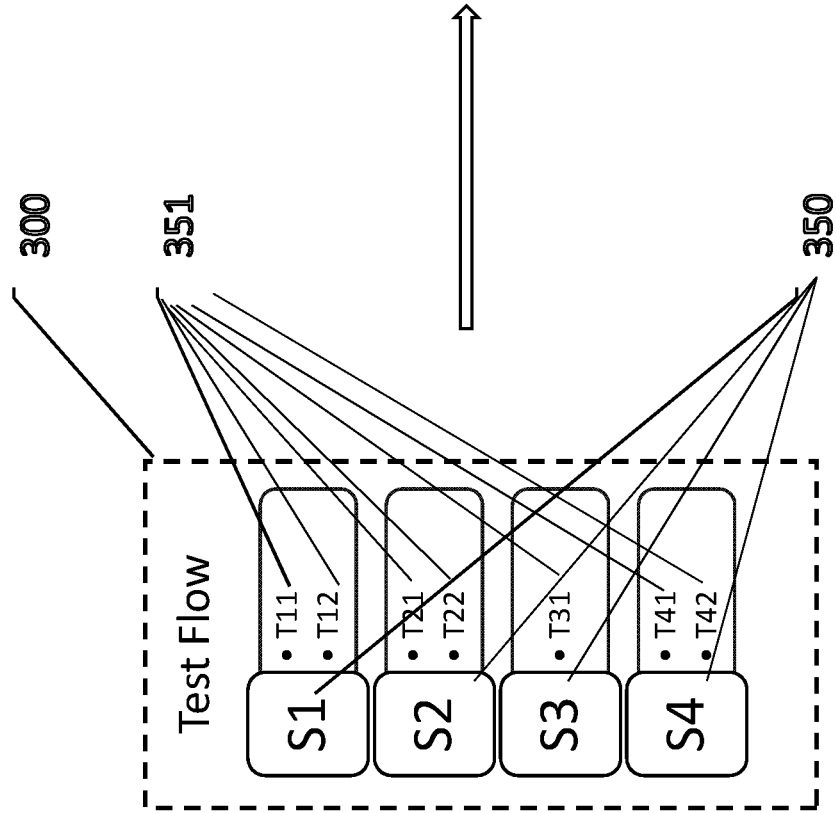

Turning now to FIG. 2A-B, it illustrates, schematically, an exemplary process of combining logically dependent groups of tests {S2 and S3} for obtaining a test flow that includes a combined group of tests {G2} that can be removed without logically affecting remaining tests. Turning at first to FIG. 2A, group of tests {S1, S2, S3, S4} 350 are designated to be candidates for removal during AT and they may potentially be removed from the execution sequence. These candidate groups may be identified in advance in preparation for the AT setup (e.g. by a server of a computer system—see discussion with reference to FIG. 6 below). Any number (none/a few/all) of tests (or test groups) may be candidates for removal from among the group of tests 350.

During AT set up process, a user, e.g. a product engineer, may review each group of tests in order to identify logical relationships between the group and the rest of tests. Thus, for example, logically dependent tests {S3} may be combined with the tests {S2}, on which they depend, to form a single logical group of tests {G2} (see FIG. 2A) that is a candidate for removal. The resulting group G2 contains logically dependent tests while the rest of the tests (by this example tests in groups G1 and G3) of the group of tests (300) are not logically dependent on any of the tests within the group G2. The latter may be considered a group of tests that is a candidate for removal 360 and may potentially be removed during real-time AT without logically affecting remaining tests. For as long as no other tests depends on G1 or G3, the groups G1 and G3 may also be considered groups of tests that are candidates for removal 360 and may potentially be removed during real-time AT without logically affecting remaining tests.

Note that the step of reviewing the group of tests for logical dependencies may be obviated, in which case the group(s) of tests that is (are) candidates for removal is automatically considered a candidate for removal group.

In addition to logical dependence, the candidate group of tests may inter alia serve as a buffer for settling time for residual noise left from a preceding test or tests of the specified candidate group, thus enabling tests following after such a candidate group to be executed properly. Removing such a group of tests that is a candidate for removal from the execution sequence may result in instability of subsequent remaining tests, even if the remaining tests are not logically dependent on the removed group.

Performance instability of a remaining test may lead to a greater fallout from the test or any other unexpected or inconsistent test results, faulty measurements or measurement logs, invalid yield loss or misclassification, higher number of test aborts or hang ups, damage to the DUT or to the testing system, and/or other undesired outcomes.

Attention is now drawn to FIG. 3A-B, illustrating, schematically, a test flow of tests (3A), corresponding execution sequence of the tests and a modified execution sequence of the tests (3B), in accordance with certain embodiments of the invention.

Figure 6:
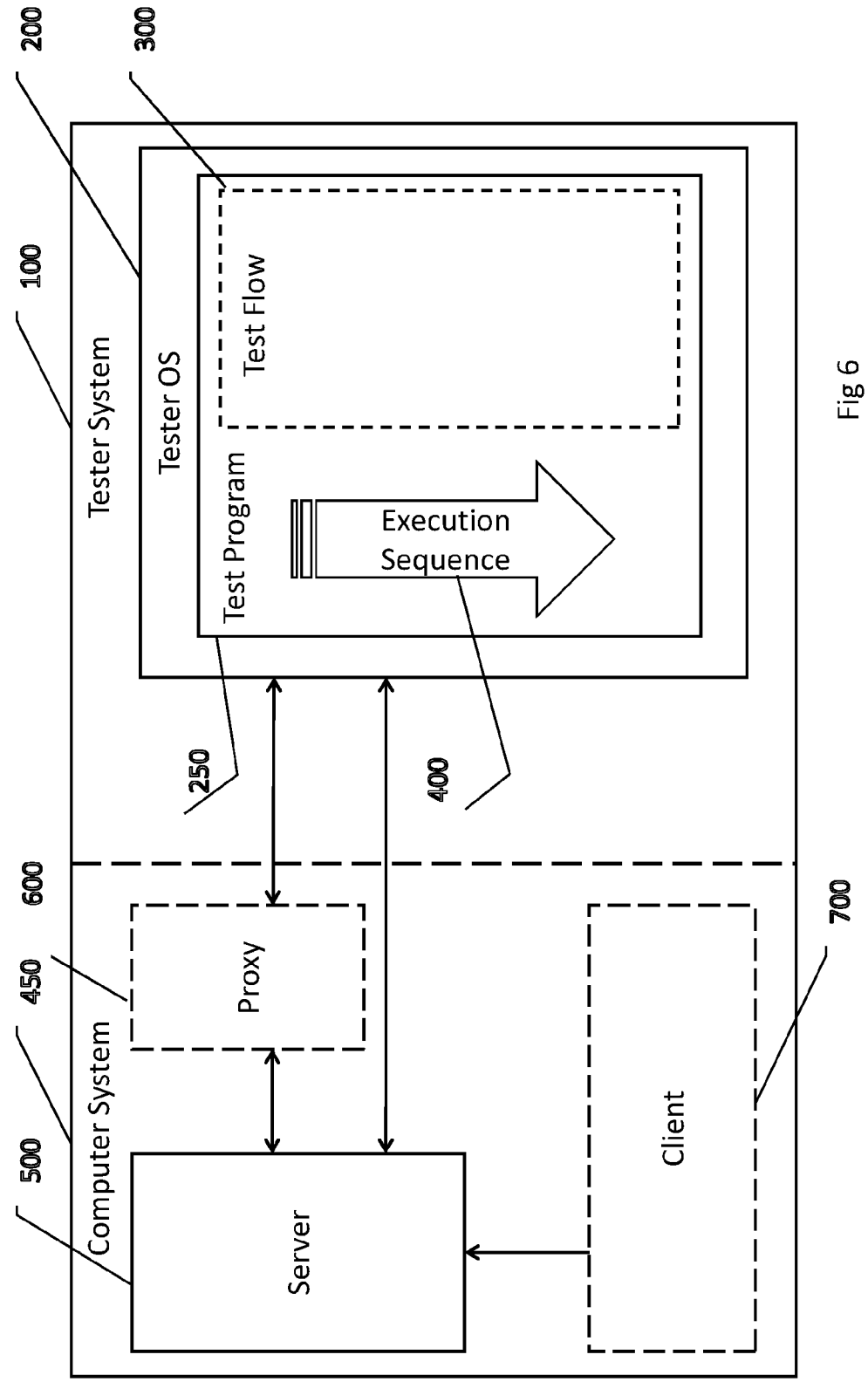
FIG. 6 illustrates a generalized system architecture of a test system and associated computer system, in accordance with certain embodiments of the invention.
Figure 7:
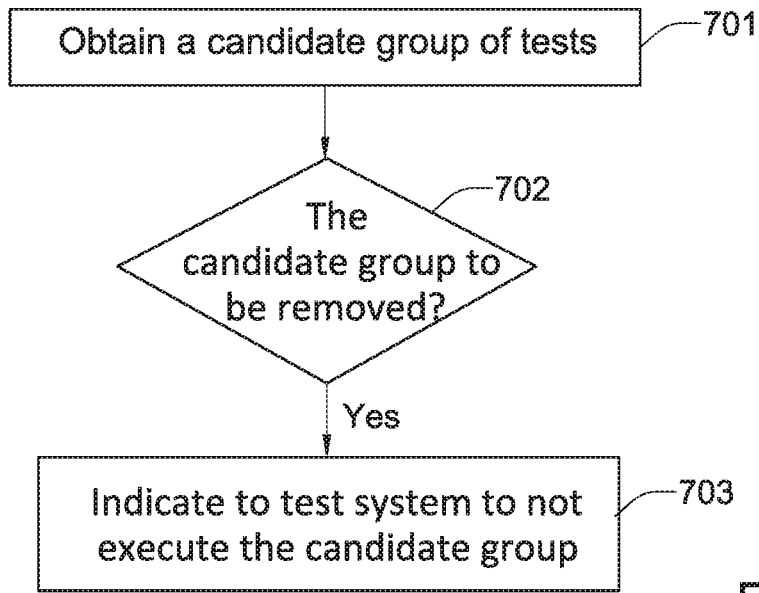
FIG. 7 illustrates a flowchart of a sequence of operations performed in a computer system according to the prior art.
Figure 8A:
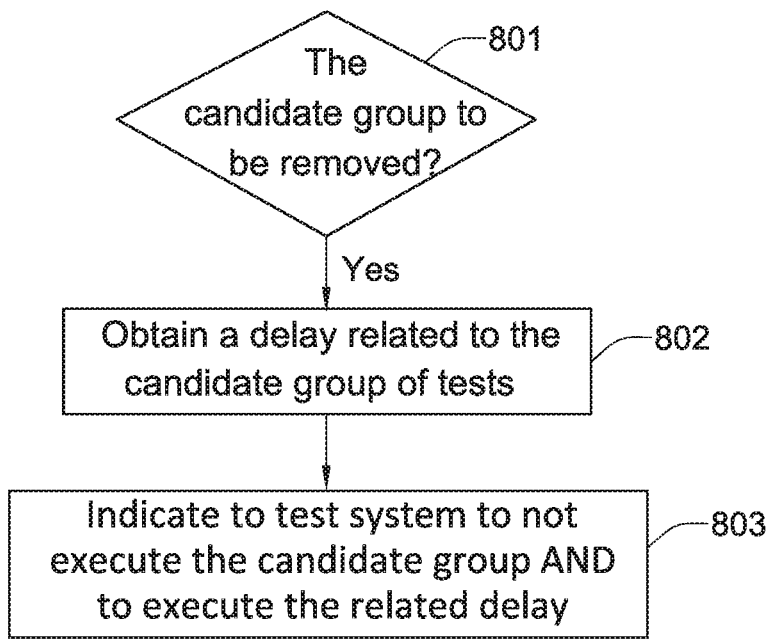
FIG. 8A illustrates a flowchart of a sequence of operations performed in a computer system, according to certain embodiments of the invention.

Reference will also be made to FIG. 6 illustrating a generalized system architecture of a test system and associated computer system, in accordance with certain embodiments of the invention, and to FIG. 8A illustrating a flowchart of a sequence of operations performed in a computer system, according to certain embodiments of the invention.

Consider, for example, a test flow 300 of 3 consecutive groups of tests {G1, G2, G3} that are candidates for removal.

From among the groups of tests that are candidates for removal, a decision may be made which group or groups would be replaced with a delay, if such group is removed. Such group or groups are referred to as candidates for replacement groups. This decision can be made during AT set up or e.g. during AT based on input such as client input or a rule. Not all candidates for removal groups are candidates for replacement groups.

Note that for each group of tests that is a candidate for replacement, a delay is set to be used instead. The delay will only be used, if, during execution, it is decided to remove that group. If, during execution, it is decided not to remove that group, then the group stays and the delay is not executed.

While throughout the description the term candidate group for replacement is used, it should be noted that such a candidate group may be removed from the execution sequence or alternatively executed, depending upon a decision made during execution of the tests, all as will be explained in greater detail below.

By this example, G2 360 is a candidate for replacement. Removal of G2 from the execution sequence 400 may lead to greater fallout of group G3 although the two (G2 and G3) are logically independent. This may be explained, for example, by residual noise left after the execution of G1 that is now still in effect during the execution of G3. Before G2 was removed, it inter alia may have served as a buffer for settling time for residual noise left after execution of G1. It may be difficult to identify or characterize this dependency of G3 on G2 to serve as a buffer for settling time at the time of AT, in real-time, and therefore there may be uncertainty about how G3 will perform if G2 is removed from the execution sequence. Because of this uncertainty, it is often decided, in accordance with the prior art, not to remove G2 in real-time, thus forgoing the potential AT benefits.

In accordance with certain embodiments of the invention (shown in FIG. 3B), during real-time AT namely while executing the tests for testing the object in the test system 100 (i.e. upon executing T11 or later but before executing T21 that forms part of the candidate group G2), a delay 451 is executed in the test system 100 instead of the G2 candidate group for replacement (that is removed from the execution sequence) giving rise to a modified execution sequence of tests 400'. The indication to execute the delay instead of the candidate group for replacement may be received from computer system 450 (see FIG. 6).

The delay is executed by the test system 100 (see FIG. 6) if G2 is removed from the execution sequence 400, in other words, in place of G2, and it may serve as a buffer for settling time for residual noise left from G1 prior to execution of G3. The delay relates to G2 in a sense that its execution is conditional on non-execution of G2. This solution may reduce the risk of instability of G3, while providing test time reduction benefits as long as the delay is shorter than duration of G2, or having no impact on test time as long as the delay does not exceed the duration of G2. Assume, for example, that G2 duration is 150 ms and that the delay is 10 ms, therefore replacing G2 with such a delay would realize test time reduction of 140 ms, while allowing 10 ms for settling.

Constructing a modified sequence of operations by replacing a group of tests that is a candidate for replacement with a delay can be performed for as many candidate test groups as needed, thus enabling real-time AT for test flows with multiple test groups. The computer system 600 may provide an indication (embracing one or more indications) for executing a delay instead of a corresponding group of tests, indicating that the group is a candidate for replacement.

Note that the modified execution sequence 400' does not necessarily require constructing the entire sequence in advance before replacing the candidate group by the corresponding delay. Thus, for example, with reference to FIG. 3B, while executing G1 and before adding G3 to sequence 400', G2 is replaced by a delay. G3 can be added to the sequence at any time as long as it is included in the execution sequence before the delay 451 has elapsed.

In some cases, removal of G2 from the execution sequence may not lead to greater fallout of group G3 indicating that G2 did not serve as a buffer for settling time for residual noise left after execution of G1. In certain embodiments, it may be more efficient in terms of test time and system resources to determine (e.g. during AT set up process by a user, say a product engineer) whether a candidate for removal group does inter alia serve as a time buffer allowing for settling, in advance. So only such candidate for removal groups are considered candidates for replacement and can potentially be replaced with a delay if removed during real-time AT.

In accordance with certain embodiments, the step of determining whether the candidate for removal group serves as a buffer for settling may be obviated, in which case the candidate for removal group is automatically considered a candidate for replacement group.

Depending on test system configuration, the execution of the delay can cause the test system 100 to e.g. stay idle or sleep, or it may allow the test system to perform background activities for the duration of the delay. The test system does not execute G3 until the specified delay is executed.

Depending on test system 100 configuration, the specification of the delay, in particular its duration, can be determined during preparation for real-time AT (e.g. by a computer system 600 associated with test system 100) or in real-time and provided to the test system (by computer system 600) during AT.

In certain embodiments, the delay may be set, referred to herein in the context of setting a delay to include: a priori determined and provided to the computer system or determined by the computer system to a possible default value during preparation, with the expectation that an explicit value could be provided in real-time. For example for ATTR, the default delay can be set 0 ms so in real-time it can be decided (by computer system 600) to activate the delay by providing an explicit value which is greater than 0. In accordance with certain embodiments, the delay can be set directly to its final value.

Longer delays may provide more cushion for the buffering for settling while potentially negating the test time reduction benefits or having more negative effect on the test time. There are multiple considerations that can be taken into account independently or in conjunction with each other for calculating the delay. All such considerations may be performed in advance and a priori fed to the computer system (for later delivering to the test system) or determined by the computer system itself based on one or more rules. Such consideration may include (but is not limited to): the goal of AT, the source and nature of the residual noise, the configuration and calibration of the testing system, the properties of DUT and the properties and performance of related groups of tests, and, in some cases, general knowledge. In some cases there may not be enough specific data to calculate a precise value for the delay and in such cases the delay can be estimated based at least in part on general knowledge. For example, certain types of semiconductor DUTs are known to settle within 10-15 ms and therefore this range may be used for deciding the delay in the absence of better data. The data, based on which the delay is calculated, can come from an empirical analysis of the test system or of the test program, from historical data on the same system or same test program, from historical data on a related system or related test program, and from data obtained from simulation of testing.

Moving on with FIG. 3B, in accordance with certain embodiments, when a goal of removing G2 is ATTR, it may be advantageous to set the delay as short as possible and to only implement a delay if it can be set shorter than duration of the replaced group G2. The duration of G2 can sometimes be obtained from a test system or estimated, based on knowledge about the test program. A simulation based on G2 duration and a proposed delay can be used to estimate ATTR benefits and to assist in determining the delay. The invention is not bound by these examples.

In accordance with certain embodiments, when a goal of removing G2 is improving yield or preventing damage to DUT or its reliability, the delay may be set to the duration of the replaced group G2 to avoid the need for settling a related analysis. In some cases, if it is known that existing duration of G2 was not sufficient to serve as a buffer for settling time for residual noise from G1, it may be beneficial to set the delay to be longer than duration of the replaced G2.

In accordance with certain embodiments, when residual noise can at least in part be attributed to the devices within components of testing systems, the configuration and calibration data of the test system may be taken into account to provide a basis for calculating the delay to allow for settling of system related residual noise. Such data may come from the same test system as well as from other (e.g. similar) test systems. These data can be derived from historical data, empirical analysis or be based on simulation. For example, the transmission lines that connect the DUT and the test can introduce impedance based delays and therefore test systems configuration with higher impedance will require longer settling times.

When residual noise can at least in part be attributed to the DUT, the data about DUT configuration, packaging, format and behavior may be taken into account to provide a basis for calculating the delay to allow for settling of DUT related residual noise. Such data may come from the same group of DUTs and possibly from related DUTs. These data can be derived from e.g. historical data, empirical analysis or be based on simulation. For example, packaged DUT may take a longer time to settle than bare DUT due to additional load from the packaging hardware. In another example, historical data on similar DUT under similar testing conditions may show instability of G3 following a, say 10 ms delay which may indicate that a longer delay is needed. In another example, when multiple DUTs or units of a DUT are tested in parallel, and the G2 is removed on one of the units, it may be necessary to delay G3 on that unit until remaining units finish G2 or at least reach an appropriate state at which G3 can run.

In accordance with certain embodiments, the purpose of the delay (or multiple delays) may be to serve as a buffer for settling time for residual noise from G1, therefore the properties of tests comprising group G1 may be taken into account to provide a basis for calculating the delay. Such properties can include the nature of the tests and their effect on the state of the DUT or on the state of the testing system. The relevant properties may be measured or derived empirically. For example, when G1 and G3 use the same power supply, the outgoing power state of the supply from G1 may become an input to G3 once G2 is removed. Therefore the delay should be sufficient to allow for the power supply to reach the state desired for G3. In another example, when G1 and G3 use different temperature settings, the delay should be sufficient to allow for the system to be freed from residual thermal noise and the DUT to reach the temperature desired for G3. In another example, when G1 and G3 use the same data bus for logging test data, the delay should be sufficient for the logging of G1 results to be finished and the bus to be freed from the residual digital noise before it can be used by G3. The invention is not bound by these examples.

In accordance with certain embodiments, the purpose of the delay (or delays) may be to serve as a buffer for settling time so G3 can be executed properly, therefore the performance of tests comprising group G3 may be taken into account to provide a basis for calculating the delay. For example, historical data about G3 performance (with or without a delay in place) may indicate higher sensitivity to settling and therefore necessitate longer delays. The historical data can be analyzed in conjunction with simulation data for G3 to detect performance instability.

Bearing all this in mind, attention is drawn to FIG. 8A, illustrating a flowchart of a sequence of operations performed in a computer system, for modifying the execution sequence of tests, according to certain embodiments of the invention. Thus, while executing the tests in the test system 100 (which, by one non-limiting example may be made known to computer system 450 via an indication received from the test system—not shown in FIG. 8A), if it is determined (801) that a candidate group (or groups) of tests that are candidates for replacement (see e.g., discussion with reference to FIG. 3A) then in stage 802 a delay or delays related to the candidate group(s) is (are) obtained. The delay may be set, by either calculation in computer system 450 or received as input thereto. Then, (803) the computer system 450 provides an indication (which may be one or more indications, as the case may be) to the test system 100 to execute the delay instead of the groups that are candidates for replacement. As may be recalled, an example of modifying the execution sequence was discussed with reference to FIG. 3B.

Note that the provision of indication to modify the execution sequence can be at any stage from the commencement of the execution sequence (e.g. upon executing T11 or later) but before executing the candidate group of tests (namely before executing the first test of that group).

Figure 8B:
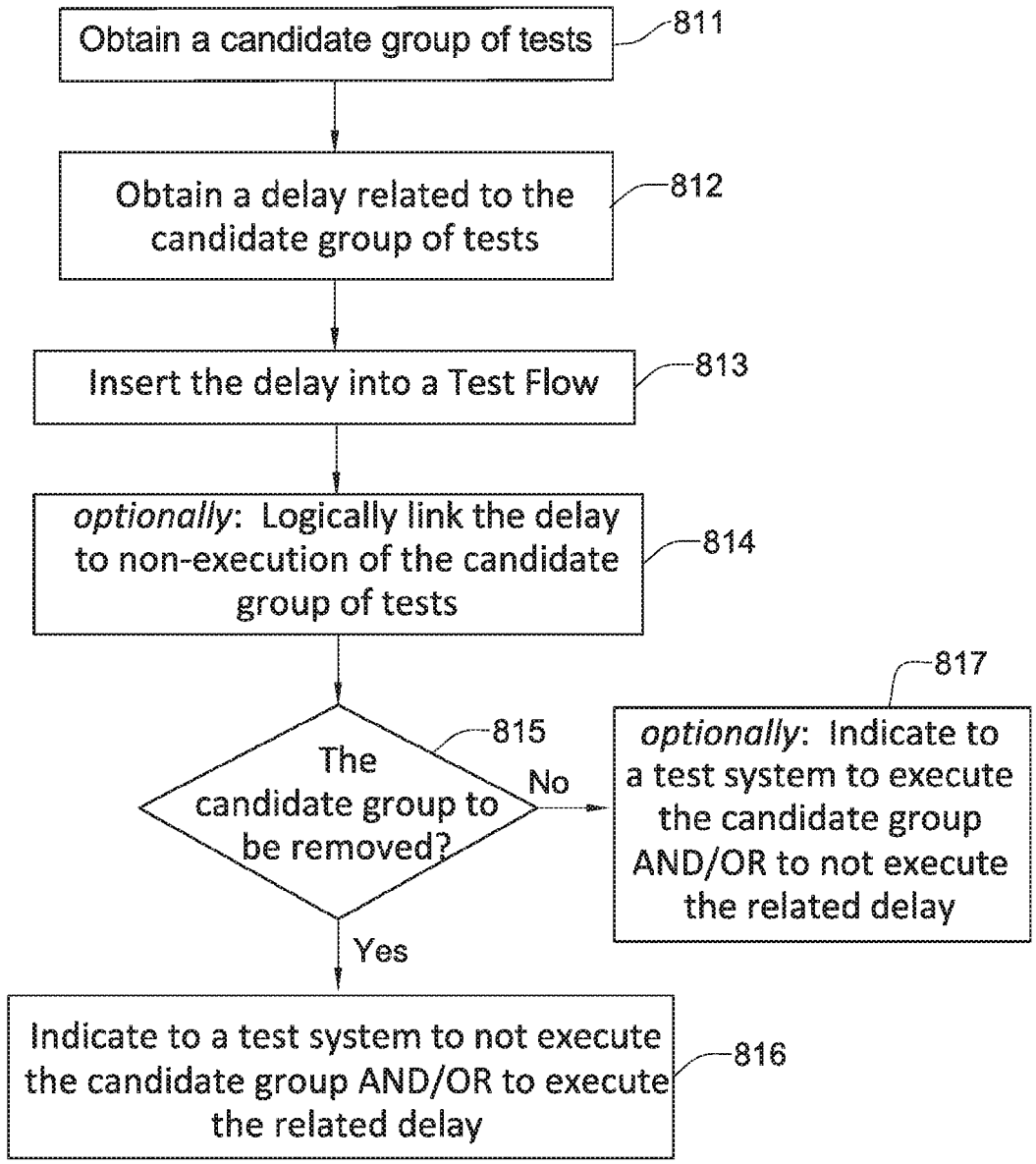
FIG. 8B illustrates a flowchart of a sequence of operations performed in a computer system, according to certain other embodiments of the invention.

Attention is now drawn to FIGS. 4A-C, illustrating, schematically, a test flow, an augmented test flow and corresponding execution sequences, in accordance with certain embodiments of the invention. Reference will also be made to FIG. 6 illustrating a generalized system architecture of a test system and associated computer system, in accordance with certain embodiments of the invention, and to FIG. 8B illustrating a flowchart of a sequence of operations performed in a computer system, according to certain other embodiments of the invention.

Thus, in accordance with certain embodiments, depending on test system configuration and requirements, a test flow augmentation may be used to enable real-time modification of the execution sequence. In other cases, an existing API function or any other suitable programmatic mechanism can be used to enable real-time modification of the execution sequence, e.g. as discussed with reference to FIGS. 3A-B above.

In accordance with certain embodiments of the invention, in preparation for real-time AT, the test flow is augmented by inserting a delay to the group of tests for selectively executing either the delay or the candidate group of tests. This enables either an execution sequence that excludes G2 but includes execution of the delay, in other words in place of G2, or, alternatively, an execution sequence that includes G2 but excludes execution of the delay. The addition of the delay may be done without restructuring the test program or modifying existing test content and therefore it does not require lengthy test program qualification. The delay relates to G2 in a sense that its execution is conditional on non-execution of G2.

The steps of augmenting the test flow can be repeated for as many test groups as needed thus enabling real-time AT for test flows with multiple test groups.

Turning to FIG. 4A, in preparation for real-time AT, the group of tests is {G1, G2, G3} 300 FIG. 4A is augmented to incorporate an alternative test group D2 370 (see FIG. 4B), execution of which would result in execution of a delay 451 within the modified execution sequence 400' (as will be discussed with reference to FIG. 4C below). For clarity of explanation, the augmented test flow can be visualized as {G1, [G2, D2], G3} or {G1, [D2, G2], G3} where groups G2 and D2 are executed interchangeably. The test flow augmentation may be realized in computer system 450 and provided to the test system 100. Note that computer system 450 may augment the test flow upon receipt of an indication that the test flow is loaded (encompassing while being loaded or after the load operation has been completed) by the test system 100.

Based on the so provided augmented test flow (see FIG. 4B), during real-time AT application, the computer system 450 may receive an indication from the test system 100 on the commencement of execution of the tests according to an execution sequence which may be constructed at least partially based on the test flow. The commencement of execution may refer to a stage upon execution of T11 or at a later stage, however before any of the tests embraced by G2 are executed (namely before group of tests G2 is executed). Computer system 450 may then provide an indication based on the augmented test flow that G2 is to be removed from the execution sequence, followed by which D2 is executed instead, and the resulting modified execution sequence can be visualized as {G1, D2, G3} giving rise to the modified execution sequence depicted in FIG. 4C. Note that in accordance with certain embodiments, the computer system 450 may conclude the execution of the tests not necessarily by receiving an indication from the test system, but rather based on other considerations, e.g. based on data from previous tests or tests output that it received (from the test system), all as known per se.

Alternatively, computer system 450 may then provide to test system 100 an indication that G2 is not to be removed from the execution sequence; then D2 is not executed and the resulting (original) execution sequence can be visualized as {G1, G2, G3}.

Note that in accordance with this embodiment, test flow augmentation does not modify the content of G1, G2 or G3. For instance, the test group D2 may contain a single test with a single instruction to the test system to sleep for 15 ms, but there could be other ways to specify the delay depending on test system configuration. For example, the duration of the delay can be specified in units of time or in clock cycles. Similarly, depending on test system configuration, there also could be other ways to augment the test flow to incorporate an alternative test group. It is advantageous to create an inverse relationship between G2 and D2 within the flow, such that the execution of D2 is conditional on non-execution of G2.

Bearing this in mind and turning to FIG. 8B, the candidate group(s) of test (for replacement) and the related delay(s) are obtained, shown as 811 and 812. A test flow augmentation is performed 813 by inserting a delay (see e.g. FIG. 4B) allowing selective execution of either the candidate group or the delay (e.g. step 814). Note, the logical connection between the group and the delay is optional since not all test systems can process a test flow with such connection. Systems that can process the connection may be provided with an indication to "execute D2", and the G2 does not get executed automatically based on the logical connection, while others have to be provided with an indication "skip D2, execute G2" since there is no logical connection between G2 and D2.

Note that providing an indicating to the test system discussed herein may include any known per se manner.

Reverting to FIG. 8B, for those candidates to be replaced 815, the computer system provides to test system 100 (upon commencing the execution sequence of tests as discussed above) an indication to modify the execution sequence by executing the delay instead of the candidate group for replacement 816. In case that logical link has been established (814), an indication not to execute the candidate group or execute the delay may suffice. Alternatively, if no such logical link is established, an indication not to execute the candidate group and execute the delay may be required. The invention is not bound by these examples.

Alternatively, in cases where the candidate group should be retained 817, the computer system provides an indication to the test system to execute the candidate group, rather than the delay. Considering that such an option may be a priori included in the augmented test flow (e.g. by using proper indication in a place holder—see discussion below), the latter step may be obviated.

With reference to FIG. 6, in accordance with certain embodiments of the invention, the computer system architecture 450 may include a Server system (Controller/Algorithmic Engine) 500, a Proxy computer system 600 and optionally a Client (Portal) 700. It is understood that all or some of the specified systems can reside within the test system 100 or be external to it. It is also understood that each system can be separate from others, combined with another system, or be embedded into another system. Each of the various systems as a whole can inter alia perform tasks which are beyond the scope of the present invention. Any of the above are examples embraced by the term computer system. The same holds true for a test system mutatis mutandis.

The Server 500 is a computer system that, among other tasks, based on various parameters such as manufacturing test data and statistical data analysis, can perform AT tasks such as identifying one or more groups of tests that are candidates for removal. The Server 500 may also perform tasks such as determining the logical dependencies between the group of tests that is a candidate for removal and the rest of the tests, as discussed in detail with reference to FIGS. 2A-B above, and determining the candidate group(s) for replacement from among the candidate groups for removal. The server 500 may, in accordance with certain embodiments, perform the task of augmenting the test flow as described, e.g. with reference to FIG. 4A-B. Any of the specified tasks (or others may be wholly processes or calculated in Server computer system 500 or alternatively partially (or wholly) based on input(s) received at server 500 from an external source.

In accordance with certain embodiments, the receipt and/or provision of the various indication(s) discussed above may be implemented by means of a Proxy computer system. The Proxy, based on information received from the Server, or inputs from the Client if present, may provide indications (e.g. instructions) to the test system 100 (e.g. tester OS), receive indications (e.g. responses and/or data from the test system (e.g. OS) and, whenever necessary, pass them to the Server or to the Client, if present.

If present, the Client 700 may be in communication with the Proxy computer system 600 and, in some cases, with the Server 500. The Client may receive inputs (such as Delay duration, identification for a group to be replaced, etc.) from the user and pass related information to the Proxy or Server. The Client can also receive responses and data from the Proxy or Server and display related information to the user.

In accordance with certain embodiments, during real-time AT, the Server determines if a candidate for replacement group needs to be removed from the execution sequence. If the decision is to remove, then based on corresponding input from the Server, the Proxy signals non-execution of said group and execution of the delay to the test OS using an existing API function or any other suitable programmatic mechanism.

In accordance with certain other embodiments, instead of the Proxy 600, a known per se Application Programming Interface (API) may be utilized by computer system 450. Thus, for example, the test OS of test system 100 may instead query the Server for an indication if a candidate group needs to be removed from the execution sequence using an existing API function or any other suitable programmatic mechanism.

Note that the utilization of Proxy or API are only examples of association between the computer system 450 and the test system 100.

Bearing this in mind, and depending on test system configuration and requirements, a test flow augmentation may be used to enable real-time modification of the execution sequence.

Thus, in accordance with certain embodiments, when test flow augmentation is used, in preparation for real-time AT, after loading the test program but before validating it, the Proxy in conjunction with the test OS augment the test flow by injecting a place holder, or slot, for the time delay for a candidate for replacement group of tests. This is illustrated schematically in FIG. 5B by designating slot 361. The various other elements depicted in FIGS. 5A-C are similar to those of corresponding FIGS. 4A-C which were described in detail above.

Bearing this in mind, the candidate for replacement group is identified among all groups by the Server and is communicated to the Proxy. The slot is injected as a new entry into the test flow without modifying existing tests within the flow. A slot contains a place holder for the actual length of delay. The place holder may hold a default value for the delay to be used if no other value is provided. A slot is logically linked to non-execution of the related candidate for replacement group of tests so they will be executed interchangeably. This logical link can, for instance, be realized by utilizing an inverted value, also known as logical pair, of a logical parameter that signals execution of the related group. An example of such a pair can be (true/false), (1/0), (−1/1) etc. and its syntax depends on test system requirement.

In accordance with certain embodiments, during real-time AT, the Server determines if the candidate for replacement group needs to be removed from the execution sequence. If the decision is to remove, then based on corresponding input from the Server, the Proxy uses the said logical parameter to signal non-execution of said group to the test OS. The inversion of this parameter in turn signals the test OS to execute the related delay. Alternatively, if the decision is not to remove, then based on corresponding input from the Server, the Proxy uses the said logical parameter to signal execution of the said group to the test OS. The inversion of this parameter in turn signals the test OS not to execute the related delay. In some testing systems, said signaling of execution of said group is not required and no related communication from the Server or the Proxy is necessary.

The Server may at least partly rely on a set of rules for determining whether a given test flow is to be augmented. For example, such a rule may list a set of requirements such as appropriate group of material, location, test system identification, etc. which must be met for the augmentation to take place.

Similarly, the Server may at least partly rely on a set of rules for determining the delay to be executed in place of removed G2. For example, such a rule may list groups of material and corresponding delays.

Note that the invention is not bound by the utilization of a slot/place holder during the augmentation phase for facilitating the modification of the execution sequence.

It should be noted, generally, that in accordance with certain embodiments of the invention, executing of the delay or delays) reduces the risk of instability arising from the removal of the candidate group(s) of tests.

In the following detailed description, numerous specific details are set forth in order to provide a thorough understanding of the invention. However, it will be understood by those skilled in the art that the present invention may be practiced without these specific details. In other instances, well-known features, structures, characteristics, stages, methods, procedures, modules, components and systems, have not been described in detail so as not to obscure the present invention.

Unless specifically stated otherwise, as apparent from the following discussions, it is appreciated that throughout the specification discussions utilizing terms such as "processing", "executing", "calculating", "computing", "determining", "obtaining", "setting", "providing" "augmenting" or the like, include action and/or processes of a computer that manipulate and/or transform data into other data, said data represented as physical quantities, e.g. such as electronic quantities, and/or said data representing the physical objects.

The term computer should be expansively construed to cover any kind of electronic with data processing capabilities and which is made up of any combination of hardware, software and/or firmware and which includes at least some hardware, even if not labeled as such in the disclosure. Non limiting examples of a computer include computer system test system or a part thereof. The latter may include one or more computers co-located or spaced apart.

The operations in accordance with the teachings herein may be performed by a computer specially constructed for the desired purposes or by a general purpose computer specially configured for the desired purpose by a computer program stored in a non-transitory computer readable storage medium. The term "non-transitory" is used herein to exclude transitory, propagating signals, but to otherwise include any volatile or non-volatile computer memory technology suitable to the application.

Reference in the specification to "certain embodiments", "e.g.", "example" "a case", "some cases", "another case", or variants thereof means that a particular feature, structure, characteristic, stage method, module described in connection with the embodiment(s) is included in at least one non-limiting embodiment of the presently disclosed subject matter. Thus the appearance of any of these phrases or variants thereof does not necessarily refer to the same embodiment(s) and may be combined with other embodiments.

Embodiments of the presently disclosed subject matter are not described with reference to any particular programming language. It will be appreciated that a variety of programming languages may be used to implement the teachings of the presently disclosed subject matter as described herein.

It is appreciated that, unless specifically stated otherwise, certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable sub-combination.

In embodiments of the presently disclosed subject matter, fewer, more and/or different stages than those shown in FIGS. 8A and 8B may be executed. In embodiments of the presently disclosed subject matter one or more stages illustrated in FIGS. 8A, 8B-B may be executed in a different order and/or one or more groups of stages may be executed simultaneously. FIG. 6 illustrates a general schematic of the system architecture in accordance with an embodiment of the presently disclosed subject matter. Each module in FIG. 6. may include any combination of software, hardware and/or firmware that performs the functions as defined and explained herein. The modules in FIG. 6 may be centralized in one location or dispersed over more than one location. In other embodiments of the presently disclosed subject matter, the system may comprise fewer, more, and/or different modules than those shown in FIG. 6.

Alternatively to the example shown in FIG. 6, system 450 may in some examples include fewer, more and/or different modules than shown in FIG. 6. Alternatively to the example shown in FIG. 6, the functionality of system 450 may in some examples be divided differently among the modules illustrated in FIG. 6. Alternatively to the example shown in FIG. 6, the functionality of system 450 described herein may in some examples be divided into fewer, more and/or different modules than shown in FIG. 6 and/or system 450 may in some examples include additional, less, and/or different functionality than described herein.

The computer system of FIG. 6 comprises or is otherwise associated with one or more processors configured to execute operations as disclosed herein. The term processor as used herein should be expansively construed to cover any kind of electronic device with data processing capabilities, including, by way of non-limiting example, by way of non-limiting example, a personal computer, a server, a computing system, a communication device, a processor (e.g. digital signal processor (DSP), a microcontroller, a field programmable gate array (FPGA), an application specific integrated circuit (ASIC), etc.), any other electronic computing device, and or any combination thereof.

It is to be understood that the presently disclosed subject matter is not limited in its application to the details set forth in the description contained herein or illustrated in the drawings. The presently disclosed subject matter is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the present presently disclosed subject matter.

It will also be understood that the system according to the presently disclosed subject matter can be implemented, at least partly, as a suitably programmed computer. Likewise, the presently disclosed subject matter contemplates a computer program being readable by a computer for executing the disclosed method. The presently disclosed subject matter further contemplates a machine-readable memory tangibly embodying a program of instructions executable by the machine for executing the disclosed method.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It will be appreciated that the embodiments described above are cited by way of example, and various features thereof and combinations of these features can be varied and modified.

While various embodiments have been shown and described, it will be understood that there is no intent to limit the invention by such disclosure, but rather, it is intended to cover all modifications and alternate constructions falling within the scope of the invention, as defined in the appended claims.

The invention claimed is:

1. A method for modifying an execution sequence of tests for testing an object on a test system; the tests include a group of tests that is a candidate for replacement, the method comprising:
    while executing the tests on the test system according to the execution sequence and before executing the group of tests, modifying, in real time, the execution sequence, said modification including:
    executing, by the test system, a delay instead of the group of tests, such that the group of tests is not executed in the execution sequence, and
    wherein the delay is related to the group of tests.

2. The method according to claim 1, wherein said modifying the execution sequence includes: receiving in the test system an indication to execute the delay related to the group of tests and to not execute the group of tests.

3. The method according to claim 1, wherein a test flow is augmented by a computer system before the execution of the tests by inserting the delay related to the group of tests, for selectively executing either the delay or the group of tests, and
    wherein, modifying the execution sequence includes: at least one of (i) receiving in the test system an indication to not execute the group of tests, and (ii) receiving in the test system an indication to execute the delay.

4. The method according to claim 1, wherein remaining tests in the execution sequence are not logically dependent on the group of tests.

5. The method according to claim 1, wherein the group of tests serves at least as a time buffer for settling time after previous tests in the execution sequence.

6. The method according to claim 1, wherein the tests include at least one other group of tests that is a candidate for replacement, and wherein said modifying the execution sequence includes executing at least one other delay instead of the at least one other group of tests, wherein the at least one other delay is related to the at least one other group of tests.

7. The method according to claim 1, wherein the object is a semiconductor chip.

8. The method according to claim 1, wherein execution of the delay reduces the risk of instability arising from the removal of the group of tests.

9. A method for providing an indication to a test system to modify an execution sequence of tests for testing an object on the test system; the tests include a group of tests that is a candidate for replacement: comprising, by a computer system associated with the test system:
while the tests are being executed by the test system according to the execution sequence,
if it is determined that the group of tests is not to be executed, obtaining a delay related to the group of tests, and
before the group of tests is executed, providing the indication to said test system to modify in real time the execution sequence of the tests for executing the delay instead of the group of tests, and for not executing the group of tests.

10. The method according to claim 9, wherein the at least one of the delay and the group of tests is determined by the computer system based on one or more rules.

11. The method according to claim 9, wherein the delay is shorter than an execution duration of the group of tests related thereto.

12. The method according to claim 9, wherein the delay is set to a default value.

13. The method according to claim 9, wherein the delay is set at least partly based on an input received by the computer system.

14. The method according to claim 9, wherein the delay is set at least partly based on estimated settling time.

15. The method according to any one of claim 9, wherein the delay is set at least partly based on the execution duration of the group of tests.

16. The method according to claim 9, wherein the delay is set at least partly based on properties of tests that precede said group of tests.

17. The method according to claim 9, wherein the delay is set at least partly based on historical performance of tests that follow after said group of tests.

18. The method according to claim 9, wherein the delay is set at least partly based on calibration data for the test system.

19. The method according to claim 9, wherein the delay is set at least partly based on simulation data.

20. The method according to claim 9, further comprising:
in response to said provision of indication, the test system executing the delay instead of the group of tests.

21. The method according to claim 9, wherein the tests include at least one other group of tests that is a candidate for replacement, and wherein said indication to modify the execution sequence is provided for executing at least one other delay instead of the at least one other group of tests, wherein the at least one other delay is related to the at least one other group of tests.

22. A method for providing an indication to a test system to modify an execution sequence of tests for testing an object on the test system, the tests including a group of tests that is a candidate for replacement: comprising, by a computer system associated with the test system:
(i) obtaining the group of tests;
(ii) receiving from the test system a first indication that a test flow is loaded;
(iii) augmenting the test flow by inserting the delay related to the group of tests for selectively executing either the delay or the group of tests and providing the augmented test flow to the test system;
(iv) while the tests are being executed by the test system according to the execution sequence,
if it is determined that the group of tests is not to be executed, obtaining a delay related to the group of tests, and
before the group of tests is executed, providing the indication to said test system to modify in real time the execution sequence of the tests for executing the delay instead of the group of tests.

23. The method according to claim 22, further comprising:
in response to said provision of indication, said test system executing said delay instead of said group of tests.

24. The method according to claim 22, wherein the tests include at least one other group of tests that is a candidate for replacement, and wherein said augmentation of the test flow further includes inserting at least one other delay related to the at least one other group of tests for, with respect to any other delay and related other group of tests, selectively executing either the other delay or the other group of tests.

25. The method according to claim 24, wherein said indication to modify the execution sequence is provided for executing the at least one other delay instead of the at least one other group of tests.

26. A computer system for providing an indication to a test system associated therewith to modify an execution sequence of tests for testing an object on the test system; the tests include a group of tests that is a candidate for replacement, the computer system being configured to perform, including:
while the tests are being executed by the test system according to the execution sequence,
if it is determined that the group of tests is not to be executed, obtaining a delay related to the group of tests, and
before the group of tests is executed, providing the indication to said test system to modify in real time the execution sequence of the tests for executing the delay instead of the group of tests, and for not executing the group of tests.

27. The computer system according to claim 26, further comprising:
in response to said provision of indication, said test system being configured to execute said delay instead of said group of tests.

28. The computer system according to claim 26, wherein the tests include at least one other group of tests that is a candidate for replacement, and wherein said indication to modify the execution sequence is provided for executing at least one other delay instead of the at least one other group of tests, wherein the at least one other delay is related to the at least one other group of tests.

29. The computer system according to claim 26, wherein the test system is associated with the computer system by utilizing an Application Programming Interface (API).

30. The computer system according to claim 29, being configured to provide said indication to the test system through the API.

31. The computer system according to claim 26, wherein the computer system includes a first computer system and a proxy computer system and wherein the test system is associated with the computer system by utilizing the Proxy computer system.

32. The computer system according to claim 31, wherein said first computer system being configured to provide said indication to the test system through the proxy computer system.

33. A computer system for providing an indication to a test system associated therewith to modify an execution sequence of tests for testing an object on the test system; the tests include a group of tests that is a candidate for replacement, the computer system being configured to perform, including:
(i) obtaining the group of tests;
(ii) receiving from the test system a first indication that a test flow is loaded;
(iii) augmenting the test flow by inserting the delay related to the group of tests for selectively executing either the delay or the group of tests and providing the augmented test flow to the test system;
(iv) while the tests are being executed by the test system according to the execution sequence,
if it is determined that the group of tests is not to be executed, obtaining a delay related to the group of tests, and
before the group of tests is executed, providing the indication to said test system to modify in real time the execution sequence of the tests for executing the delay instead of the group of tests.

34. The computer system according to claim 33, further comprising in response to said provision of indication, said test system being configured to execute said delay instead of said group of tests.

35. The computer system according to claim 33, wherein the tests include at least one other group of tests that are candidates for replacement, and wherein said augmentation of the test flow further includes inserting at least one other delay related to the at least one other group of tests for, with respect to any other delay and related other group of tests, selectively executing either the other delay or the other group of tests.

36. The method according to claim 33, wherein said indication to modify the execution sequence is provided for executing the at least one other delay instead of the at least one other group of tests.

37. The computer system according to claim 33, wherein the test system is associated with the computer system by utilizing an Application Programming Interface (API).

38. The computer system according to claim 37, being configured to receive said first indication from the test system and to provide said indication to the test system through the API.

39. The computer system according to claim 33, wherein the computer system includes a first computer system and a proxy computer system and wherein the test system is associated with the computer system by utilizing the Proxy computer system.

40. The computer system according to claim 39, wherein said first computer system being configured to receive said first indication from the test system through the proxy computer system, and wherein said first computer system being configured to provide said indication to the test system through the proxy computer system.

41. The computer system according to claim 33, being configured to augment the test flow of the tests including specifying said delay as a slot.

42. A computer program product comprising a non-transitory computer useable medium having computer readable program code embodied therein for providing an indication to a test system to modify an execution sequence of tests for testing an object on the test system; the tests include a group of tests that is a candidate for replacement the computer program product comprising:
computer readable program code for causing the computer system, while the tests are being executed by the test system according to the execution sequence,
if it is determined that the group of tests is not to be executed, obtaining a delay related to the group of tests, and before the group of tests is executed, providing the indication to said test system to modify in real time the execution sequence of the tests for executing the delay instead of the group of tests, and for not executing the group of tests.

43. A computer program product comprising a non-transitory computer useable medium having computer readable program code embodied therein for providing an indication to a test system to modify an execution sequence of tests for testing an object on the test system; the tests include a group of tests that is a candidate for replacement the computer program product comprising:
computer readable program code for causing a computer system to obtain the group of tests;
computer readable program code for causing a computer system to receive from the test system a first indication that a test flow is loaded;
computer readable program code for causing a computer system to augment the test flow by inserting the delay related to the group of tests for selectively executing either the delay or the group of tests and providing the augmented test flow to the test system;
computer readable program code for causing the computer system, while the tests are being executed by the test system according to the execution sequence,
if it is determined that the group of tests is not to be executed, obtaining a delay related to the group of tests, and
before the group of tests is executed, providing the indication to said test system to modify in real time the execution sequence of the tests for executing the delay instead of the group of tests.

* * * * *